(12) United States Patent
Gwon (10) Patent No.: US 9,653,155 B1
(45) Date of Patent: May 16, 2017

(54) NONVOLATILE MEMORY DEVICE HAVING CONNECTION UNIT FOR ALLOWING PRECHARGING OF BIT LINES IN SINGLE STEP

(71) Applicant: SK hynix Inc., Gyeonggi-do (KR)

(72) Inventor: Ki-Chang Gwon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/099,146

(22) Filed: Apr. 14, 2016

(30) Foreign Application Priority Data

Nov. 13, 2015 (KR) ........................ 10-2015-0159694

(51) Int. Cl.
*G11C 16/00* (2006.01)
*G11C 11/56* (2006.01)
*G11C 16/04* (2006.01)

(52) U.S. Cl.
CPC ...... *G11C 11/5628* (2013.01); *G11C 11/5642* (2013.01); *G11C 16/0483* (2013.01)

(58) Field of Classification Search
CPC ................................................ G11C 16/0483

USPC ..................................................... 365/185.17
See application file for complete search history.

(56) References Cited

U.S. PATENT DOCUMENTS

2012/0106262 A1* 5/2012 Cho .................. G11C 16/3459
365/185.25

FOREIGN PATENT DOCUMENTS

KR         1020130012308         2/2013

* cited by examiner

*Primary Examiner* — Hoai V Ho
(74) *Attorney, Agent, or Firm* — IP & T Group LLP (57) ABSTRACT

A nonvolatile memory device may include a cell string comprising a plurality of memory cells coupled in series; a bit line coupled to the cell string; a page buffer suitable for driving a sensing node to a ground voltage, a middle voltage, and a core voltage during a normal program operation, a slow program operation and a program inhibition operation, respectively; and a connection unit suitable for coupling the bit line to the sensing node in response to a control signal of a first voltage during the slow program operation, and in response to the control signal of a second voltage higher than the first voltage during the normal program operation and the program inhibition operation.

17 Claims, 7 Drawing Sheets

NONVOLATILE MEMORY DEVICE HAVING CONNECTION UNIT FOR ALLOWING PRECHARGING OF BIT LINES IN SINGLE STEP

CROSS-REFERENCE TO RELATED APPLICATION

The present application claims priority of Korean Patent Application No. 10-2015-0159694, filed on Nov. 13, 2015, which is incorporated herein by reference in its entirety.

BACKGROUND

1. Field

Exemplary embodiments of the present invention relate to a nonvolatile memory device.

2. Description of the Related Art

A nonvolatile memory device retains data stored therein even when the power supply to the device is turned-off. Data may be stored in a nonvolatile memory by shifting the threshold voltage of a memory cell to control the amount of electrical charges retained in the conduction band of a floating gate.

Generally, when a program pulse is applied to the floating gate, the threshold voltage of the memory cell rises. The threshold voltage of the memory cell may shift depending on the value of data to be stored in the memory cell using the program pulse. Since a plurality of memory cells of nonvolatile memory may have slightly different characteristics, the threshold voltages of memory cells storing the same data are not identical, but form a distribution.

In a nonvolatile memory, memory cells storing 1-bit data or two- or three-bit data are known. A memory cell capable of storing 1-bit data is referred to as a single level cell (SLC), whereas a memory cell capable of storing two or more bits is referred to as a multi-level cell (MLC). An SLC may have an erase state or a program state depending on a threshold voltage. An MLC has an erase state or a plurality of program states depending on a threshold voltage.

Figure 1:
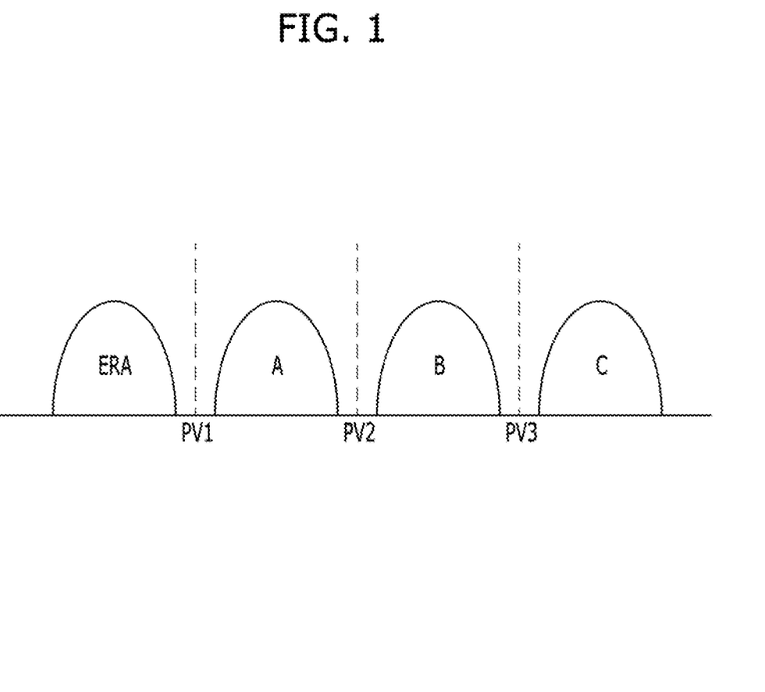
FIG. 1 is a diagram showing a distribution of threshold voltages of an MLC storing 2-bit data.

FIG. 1 is a diagram showing a distribution of threshold voltages of an MLC storing 2-bit data.

As shown in FIG. 1, the threshold voltages of memory cells may vary depending on the program states of the memory cells. Generally, the threshold voltages of memory cells in an erase state ERA are lower than a first voltage PV1. The threshold voltages of memory cells in a first program state A may be higher than or equal to the first voltage PV1 and lower than a second voltage PV2. The threshold voltages of memory cells in a second program state B may be higher than or equal to the second voltage PV2 and lower than a third voltage PV3. The threshold voltages of memory cells in a third program state C may be higher than or equal to the third voltage PV3. According to this example, in the erase state ERA and the first to third program states A, B, and C, data having different values may be stored in the memory cells.

According to this example, the first to third voltages PV1 to PV3 may be used to determine whether the memory cells have one of the erase state ERA and the first to third program states A, B, and C. In other words, the first to third voltages PV1 to PV3 may be used to verify whether memory cells have been properly programmed or to read data stored in memory cells.

A conventional verification operation is described in more detail below. When a memory cell is programmed, a program pulse is applied to a word line corresponding to the memory cell to be programmed. Thereafter, whether the memory cell has been programmed is verified by applying verification voltages to the word line corresponding to the memory cell to be programmed. The first to third voltages PV1 to PV3 are used as the verification voltages. After the verification operation, when it is determined that the memory cell has not been properly programmed, a program pulse is once again applied to the memory cell. After a verification operation, when it is determined that the memory cell has been properly programmed, the program operation of the memory cell is terminated.

As described above, the MLC may have a plurality of distributions of threshold voltages. Accordingly, in order to secure an adequate read margin when a read operation is performed on each of the types of states ERA, A, B, and C, the width of the threshold voltage distributions for each of the states ERA, A, B, and C needs to be narrow. A conventional method of narrowing the width of a threshold voltage distribution is described below with reference to FIG. 2.

Figure 2:
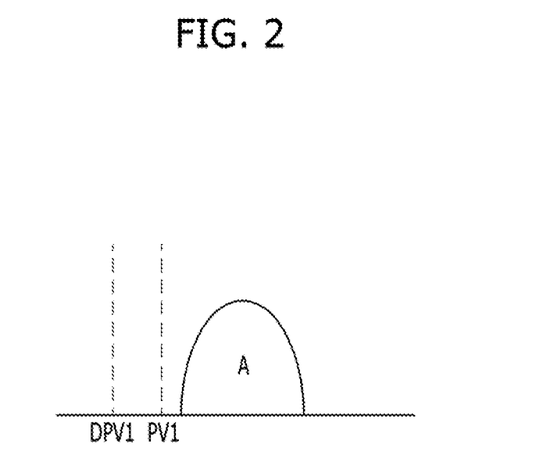
FIG. 2 is a diagram illustrating a method for narrowing a width of threshold voltage distributions.

FIG. 2 is a diagram illustrating a conventional method for narrowing the width of threshold voltage distributions. In the example of FIG. 2 memory cells are programmed in the first program state A of FIG. 1.

In a program operation, verification of whether memory cells have been programmed in the first program state A is performed using only the first voltage PV1 as a verification voltage. For narrowing the width of the threshold voltage distributions of the memory cells, however, the threshold voltages of the memory cells are verified once more using a first sub-voltage DPV1 which is lower than the first voltage PV1 as a sub-verification voltage.

According to this example, the selected memory cells are divided into first to third states. The first state is a non-program state in which the voltage levels of threshold voltages are lower than the first sub-voltage DPV1. The second state is a sub-program state in which the voltage levels of threshold voltages are higher than or equal to the first sub-voltage DPV1, and lower than the first voltage PV1. The third state is a program state in which the voltage levels of threshold voltages are higher than or equal to the first voltage PV1.

A bit line coupled to the selected memory cell is precharged to have a specific voltage depending on the state of the selected memory cell and whether the selected memory cell is a program target cell. A bit line coupled to a memory cell which is a program target cell in a non-program state is precharged with a ground voltage GND. A bit line coupled to a memory cell which is a program target cell in a sub-program state is precharged with a middle voltage $V_m$. A bit line coupled to a memory cell which is a program target cell in a program state, or which is not a program target cell is precharged with a core voltage $V_{core}$.

A normal program operation is performed on memory cells coupled to a bit line precharged with the ground voltage GND when a program pulse is applied. A slow program operation is performed on memory cells coupled to a bit line precharged with the middle voltage $V_m$ when a program pulse is applied. Memory cells coupled to a bit line precharged with the core voltage $V_{core}$ are not programmed although a program pulse is applied. That is, a program inhibition operation is performed on the memory cells coupled to the bit line precharged with the core voltage $V_{core}$ when the program pulse is applied.

During a normal program operation, the threshold voltage of a memory cell has relatively higher variation. During the slow program operation, the threshold voltage of a memory cell has relatively smaller variation. During the program inhibition operation, the threshold voltage of a memory cell is not changed. Hence, according to this conventional operation, a precharge time may be increased because a bit line needs to be precharged with one of the different three levels.

SUMMARY

Various embodiments of the invention are directed to a nonvolatile memory device capable of reducing the precharge time for a bit line. The nonvolatile memory device may precharge a bit line depending on the state of a memory cell and whether the memory cell is a program target cell. The nonvolatile memory device may precharge all the bit lines at the same time.

In an embodiment, a nonvolatile memory device may include a cell string comprising a plurality of memory cells coupled in series; a bit line coupled to the cell string; a page buffer suitable for driving a sensing node to a ground voltage, a middle voltage, and a core voltage during a normal program operation, a slow program operation and a program inhibition operation, respectively; and a connection unit suitable for coupling the bit line to the sensing node in response to a control signal of a first voltage during the slow program operation, and in response to the control signal of a second voltage higher than the first voltage during the normal program operation and the program inhibition operation.

In an embodiment, a nonvolatile memory device may include a plurality of cell strings comprising a plurality of memory cells coupled in series; a plurality of bit lines coupled to the plurality of cell strings respectively; a plurality of page buffers each being suitable for driving a sensing node to a ground voltage, a middle voltage, and a core voltage during a normal program operation, a slow program operation and a program inhibition operation, respectively; and a plurality of connection units each suitable for coupling the respective bit lines to the sensing node of the respective page buffers in response to a control signal of a first voltage during the slow program operation, and in response to the control signal of a second voltage higher than the first voltage during the normal program operation and the program inhibition operation.

In an embodiment, a nonvolatile memory device may include a plurality of cell strings each suitable for comprising a plurality of memory cells coupled in series; and a plurality of bit lines suitable for being respectively coupled to the plurality of cell strings; wherein, during a precharge section, a bit line coupled to a cell string in which a selected memory cell is programmed by a normal program operation is precharged with a ground voltage, a bit line coupled to a cell string in which a selected memory cell is programmed by a slow program operation is precharged with a middle voltage, and a bit line coupled to a cell string in which a selected memory cell is program-Inhibited is precharged with a core voltage.

DETAILED DESCRIPTION

Various embodiments of the invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the relevant art. Throughout the disclosure, like reference numerals refer to like parts throughout the various figures and embodiments of the present invention. It is also noted that in this specification, "connected/coupled" refers to one component not only directly coupling another component but also indirectly coupling another component through an intermediate component. It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. In addition, it will also be understood that when an element or layer is referred to as being "between" two elements or layers, it can be the only element or layer between the two elements or layers, or one or more intervening elements or layers may also be present.

It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or groups thereof.

The terminology used herein is for the purpose of describing particular embodiments only and is not intended to be limiting of the present disclosure. Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Hereinafter, the various embodiments of the present disclosure will be described in details with reference to the drawings.

Figure 3:
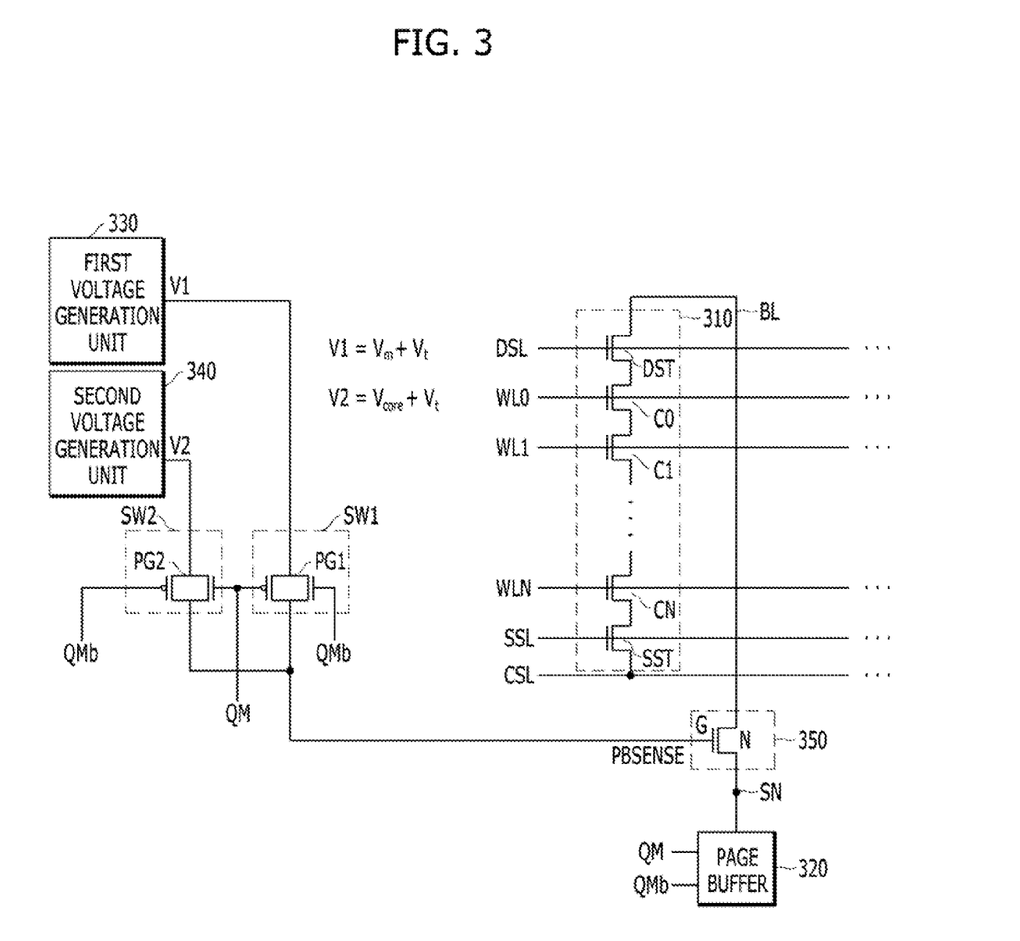
FIG. 3 shows a configuration of a nonvolatile memory device, according to an embodiment of the present invention.
Figure 4A:
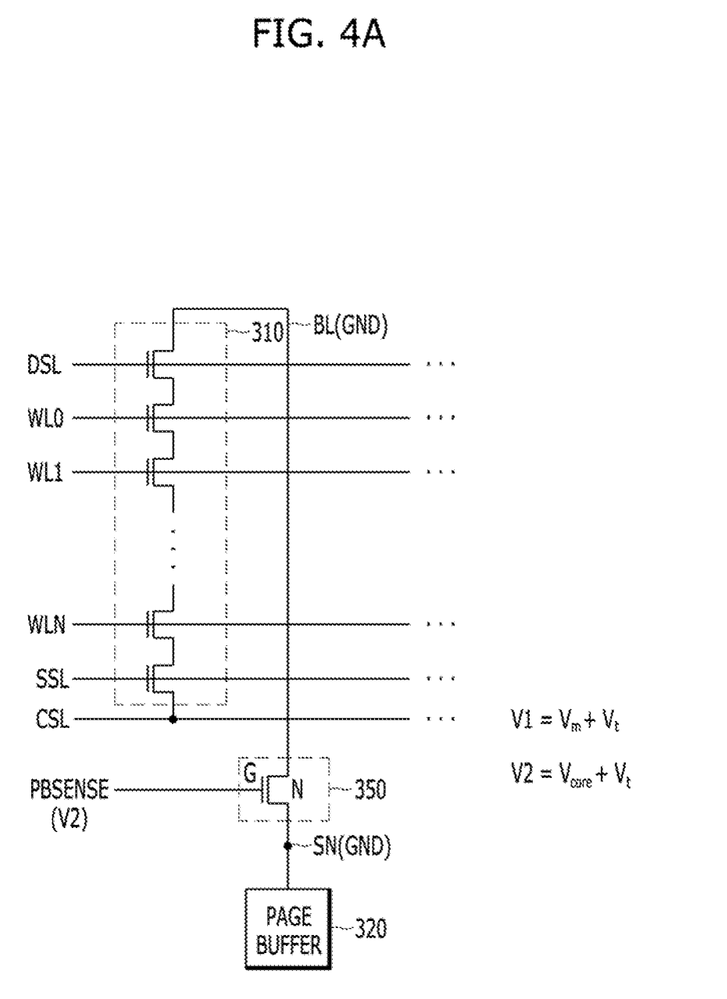
FIGS. 4A to 4C are diagrams illustrating an operation of the nonvolatile memory device of FIG. 3, according to an embodiment of the present invention.
Figure 4B:
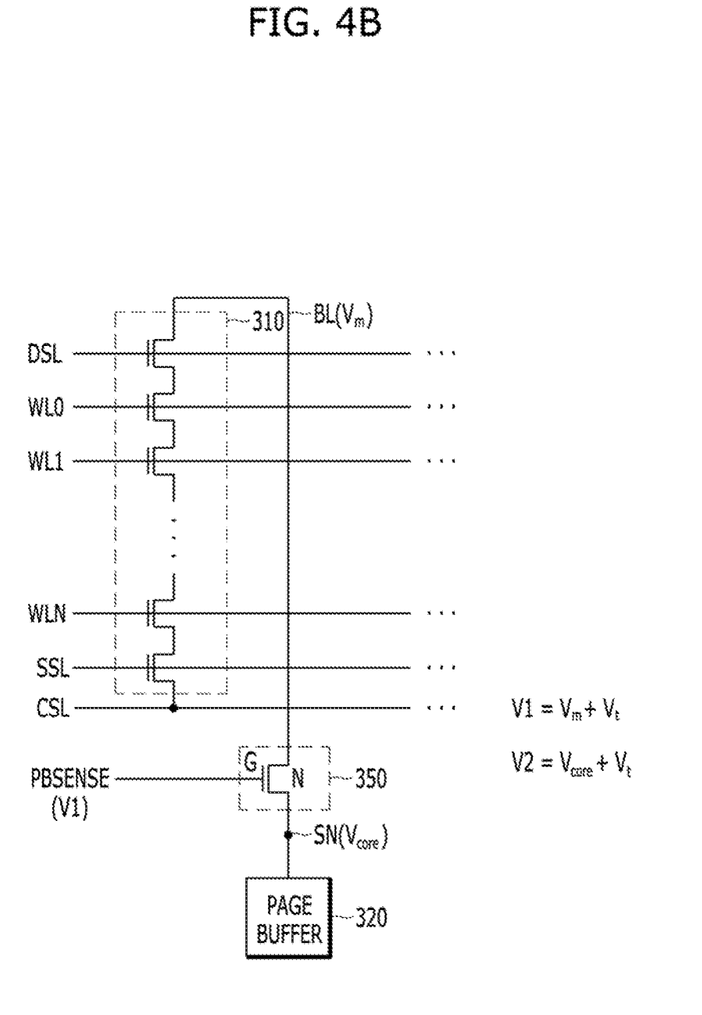
Figure 4C:
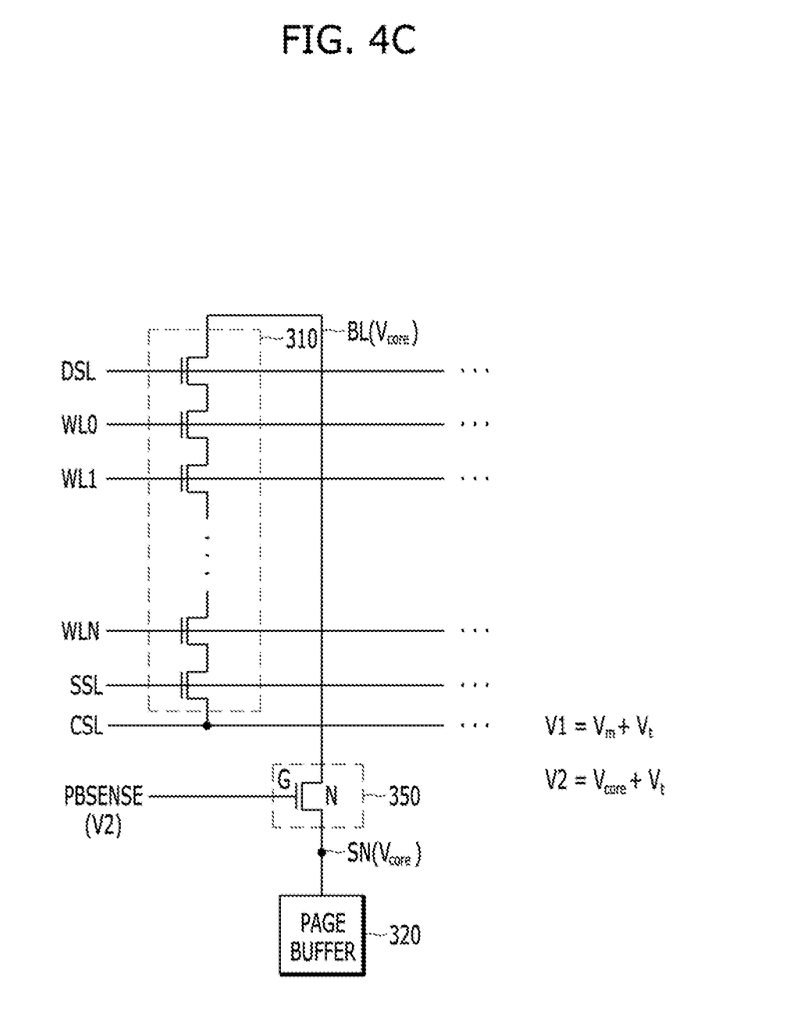

FIG. 3 shows the configuration of a nonvolatile memory device, according to an embodiment of the present invention. FIGS. 4A to 4C are diagrams illustrating an operation of the nonvolatile memory device of FIG. 3, according to an embodiment of the invention.

Referring to FIG. 3, the nonvolatile memory device may include a cell string 310, a bit line BL, a page buffer 320, first and second voltage generation units 330 and 340, a connection unit 350, and first and second switches SW1 and SW2.

The cell string 310 may be coupled between a source line CSL and the bit line BL. The cell string 310 may include a source selection transistor SST having a gate coupled to a source selection line SSL, a drain selection transistor DST having a gate coupled to a drain selection line DSL, and a plurality of memory cells C0 to CN which are coupled in series between the source selection transistor SST and the drain selection transistor DST to form a string structure. Various voltages may be applied to the floating gates of the plurality of memory cells C0 to CN through a plurality of word lines WL0 to WLN. The bit line BL may be coupled between the cell string 310 and the connection unit 350. The connection unit 350 may be coupled between the bit line BL and a sensing node SN, and may include an NMOS transistor N. A control signal PBSENSE may be inputted to the transistor N through its gate, i.e., a control terminal G of the connection unit 350.

A program operation may include a precharge operation, a program pulse application operation, and a verification operation. When the precharge operation is performed, the bit line BL may be precharged with a voltage level that is determined based on a state of the selected memory cell and whether a selected memory cell is a program target cell. If a selected memory cell is a program target cell and is in a non-program state, the bit line BL may be precharged with a ground voltage GND (see FIG. 4A) for a normal program operation. If a selected memory cell is a program target cell and is in a sub-program state, the bit line BL may be precharged with a middle voltage $V_m$ (see FIG. 4B) for a slow program operation. If a selected memory cell is not a program target cell, or the selected memory cell is a program target cell in the program state, the bit line BL may be precharged with a core voltage $V_{core}$ (see FIG. 4C) for a program inhibition operation.

The page buffer 320 may store information on whether or not a selected memory cell is a program target cell. The page buffer 320 may also store information on the state of the selected memory cell. The page buffer 320 may determine a voltage level of the sensing node SN based on the stored information. If a selected memory cell is a program target cell in the non-program state, the page buffer 320 may drive the sensing node SN to the ground voltage GND. If a selected memory cell is not a program target cell, or if a selected memory cell is a program target cell and is in a state except for the non-program state, that is, in the sub-program state or the program state, the page buffer 320 may drive the sensing node SN to the core voltage $V_{core}$. According to this example, the core voltage $V_{core}$ may be a higher voltage than the middle voltage $V_m$, and the middle voltage $V_m$ may be a higher voltage than the ground voltage GND.

Furthermore, if a selected memory cell is in the sub-program state, the page buffer 320 may deactivate a selection signal QM and activate an Inverted selection signal QMb. If a selected memory cell is in a state except for the sub-program state, that is, in the non-program state or the program state, the page buffer 320 may activate the selection signal QM and deactivate the inverted selection signal QMb.

The page buffer 320 may store first data indicative of whether a selected memory cell is in the sub-program state, that is, the selected memory cell is to be programmed by the slow program operation. If a selected memory cell is in the sub-program state, the first data may have a first value. If a selected memory cell is in a state except for the sub-program state, the first data may have a second value. If the first data has the first value, the page buffer 320 may deactivate the selection signal QM and activate the inverted selection signal QMb. If the first data has the second value, the page buffer 320 may activate the selection signal QM and deactivate the inverted selection signal QMb. The value of the first data may be determined by a verification operation, but the initial value of the first data may be set to the second value.

The first voltage generation unit 330 may generate a first voltage V1 having a value corresponding to a sum of a middle voltage $V_m$ and a threshold voltage $V_t$ of the NMOS transistor N of the connection unit 350. That is, the first voltage V1 may be equal to "$V_m + V_t$." The first switch SW1 may be coupled between the first voltage generation unit 330 and the control terminal G of the connection unit 350. When the selection signal QM is deactivated and the inverted selection signal QMb is activated, the first switch SW1 may be turned on and thus may supply the first voltage V1 to the control terminal G of the connection unit 350. The first switch SW1 may include a first pass gate PG1.

The second voltage generation unit 340 may generate a second voltage V2 having a voltage level corresponding to a sum of the core voltage $V_{core}$ and a threshold voltage $V_t$ of the NMOS transistor N of the connection unit 350. That is, the second voltage V2 may be equal to "$V_{core} + V_t$." The second switch SW2 may be coupled between the second voltage generation unit 340 and the control terminal G of the connection unit 350. When the selection signal QM is activated and the inverted selection signal QMb is deactivated, the second switch SW2 may be turned on and thus may apply the second voltage V2 to the control terminal G of the connection unit 350. The second switch SW2 may include a second pass gate PG2.

Referring to FIG. 4A, if a selected memory cell is a program target cell in the non-program state, the sensing node SN may be driven to the ground voltage GND, and the second voltage V2 may be applied to the control terminal G of the connection unit 350. Accordingly, the ground voltage GND of the sensing node SN may be transferred to the bit line BL, so the bit line BL may be precharged with the ground voltage GND.

Referring to FIG. 4B, if a selected memory cell is a program target cell in the sub-program state, the sensing node SN may be driven to the core voltage $V_{core}$, and the first voltage V1 may be applied to the control terminal G of the connection unit 350. Accordingly, the entire core voltage $V_{core}$ of the sensing node SN is not transferred, but the middle voltage $V_m$ obtained by subtracting the threshold voltage $V_t$ of the connection unit 350 from the first voltage V1, may be transferred to the bit line BL. Accordingly, the bit line BL may be precharged with the middle voltage $V_m$.

Referring to FIG. 4C, if a selected memory cell is not a program target cell, or the selected memory cell is a program target cell in the program state (i.e., a program has been completed), the sensing node SN may be driven to the core voltage $V_{core}$, and the second voltage V2 may be applied to the control terminal G of the connection unit 350. Accordingly, the core voltage $V_{core}$ of the sensing node SN may be transferred to the bit line BL, so the bit line BL may be precharged with the core voltage $V_{core}$.

Upon completion of the precharge operation, the program pulse application operation may be started. Accordingly, a program pulse for the program operation may be applied to the selected memory cell of the plurality of memory cells C0 to CN of the cell string 310, and a pass voltage for turning on unselected memory cells may be applied to the unselected memory cells.

The program pulse may be applied according to an increment step pulse program (ISPP) method. The ISPP method is widely known to those skilled in the art to which the present invention pertains, hence a description thereof is omitted. For reference, a normal program operation may be performed on a memory cell which is in the program state and coupled to the bit line BL precharged with the ground voltage GND, a slow program operation may be performed on a memory cell which is in the sub-program state and coupled to the bit line BL precharged with the middle voltage $V_m$, and a program inhibition operation may be performed on a memory cell which is in the non-program state and coupled to the bit line BL precharged with the core voltage $V_{core}$, not to be programmed, i.e., program-inhibited.

Upon completion of the program pulse application operation, the verification operation for verifying the state of the selected memory cell, i.e., the voltage level of the threshold voltage of the selected memory cell, may be performed. The verification operation may detect which one of the following three types of state the threshold voltage of a memory cell has: (1) the non-program state when the threshold voltage of the memory cell is lower than a sub-verification voltage; (2) the sub-program state when the threshold voltage of the memory cell is higher than or equal to the sub-verification voltage and is lower than a target voltage which is higher than the sub-verification voltage; or (3) the program state when the threshold voltage of the memory cell is higher than or equal to the target voltage. When the verification operation is completed, the page buffer 320 may store information on the state of the selected memory cell.

If the selected memory cell is in the non-program state or the program state, the first data may be stored as the second value. If the selected memory cell is in the sub-program state, the first data may be stored as the first value.

A conventional nonvolatile memory device as discussed in reference to FIGS. 1 and 2 performs a two-step precharge operation for a selected bit line. The first precharge operation precharges the bit line BL with the ground voltage GND or the core voltage $V_{core}$ whereas the second precharge operation precharges the bit line BL with the middle voltage $V_m$. On the contrary, the nonvolatile memory device of FIG. 3, according to an embodiment of the present invention, can reduce the time required for a precharge operation because the bit line BL is precharged in a single step regardless of which voltage is used for the precharge. Accordingly, the operating speed of the nonvolatile memory device may be substantially enhanced.

Figure 5:
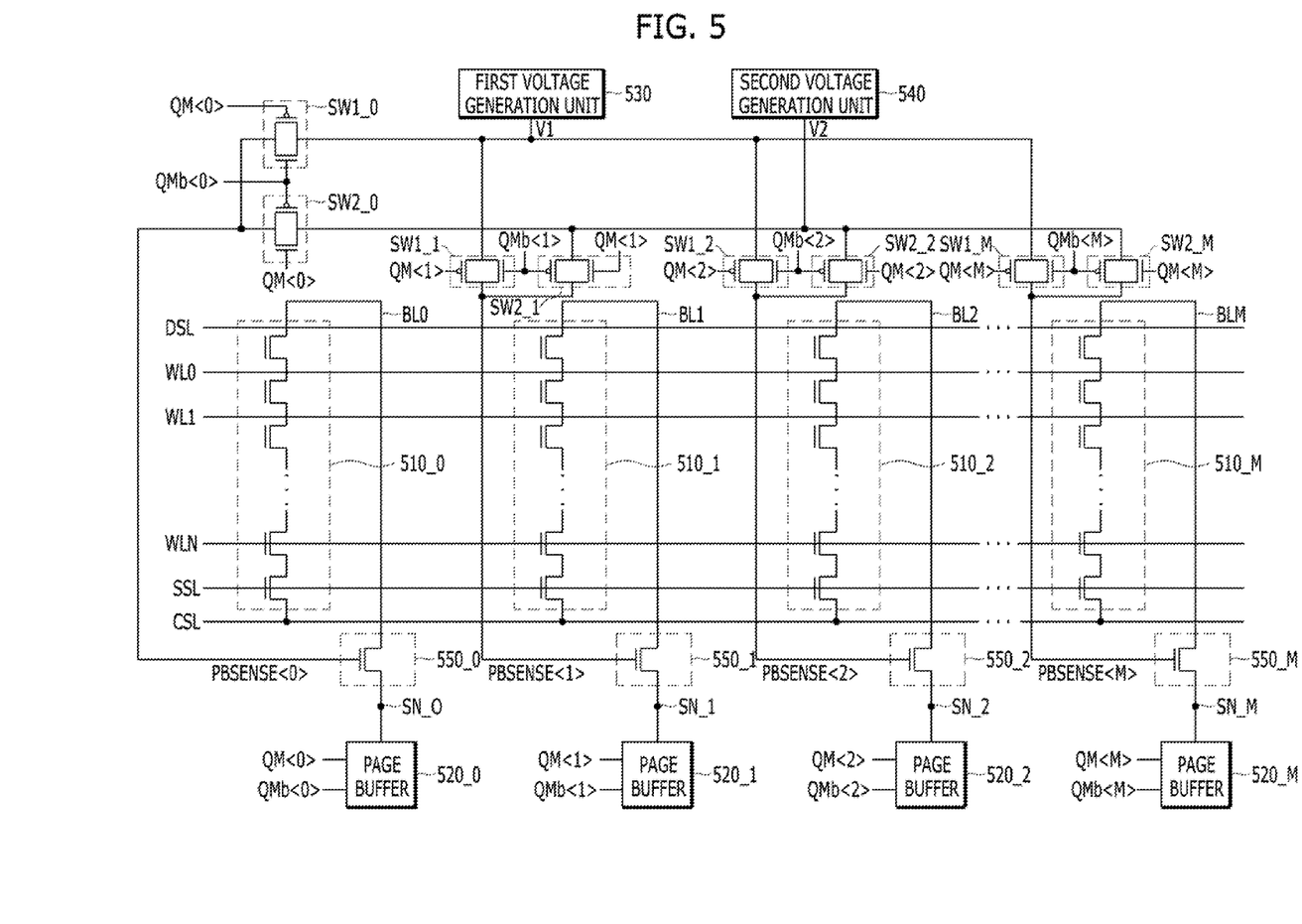
FIG. 5 shows a configuration of a nonvolatile memory device, according to an embodiment of the present invention.

FIG. 5 shows the configuration of a nonvolatile memory device, according to an embodiment of the present invention.

Referring now to FIG. 5, the nonvolatile memory device may include a plurality of cell strings 510_0 to 510_M, a plurality of bit lines BL0 to BLM, a plurality of page buffers 520_0 to 520_M, first and second voltage generation units 530 and 540, a plurality of first and second switches SW1_0 to SW1_M and SW2_0 to SW2_M, a plurality of connection units 550_0 to 550_M, and a plurality of sensing nodes SN_0 to SN_M. The plurality of connection units 550_0 to 550_M may be turned on/off in response to respective control signals PBSENSE<0:M>. Furthermore, the plurality of first and second switches SW1_0 to SW1_M and SW2_0 to SW2_M may be turned on/off in response to signals of the corresponding selection signals QM<0:M> and inverted selection signals QMb<0:M>. Symbols of memory cells included in each of the cell strings 520_0 to 520_M are omitted for convenience of illustration.

Unlike the nonvolatile memory device of FIG. 3, the nonvolatile memory device of FIG. 5 includes a plurality of cell strings 510_0 to 510_M, a plurality of bit lines BL0 to BLM, a plurality of page buffers 520_0 to 520_M, a plurality of connection units 550_0 to 550_M, and a plurality of first and second switches SW1_0 to SW1_M and SW2_0 to SW2_M. Each set of the cell strings, bit lines, page buffers, connection units, and first and second switches may independently operate like the cell string, bit line, page buffer, connection unit and first and second switches of the nonvolatile memory device of FIG. 3. According to this example, the precharge operation, program pulse application operation, and verification operation of each set may be performed at the same time.

Figure 6:
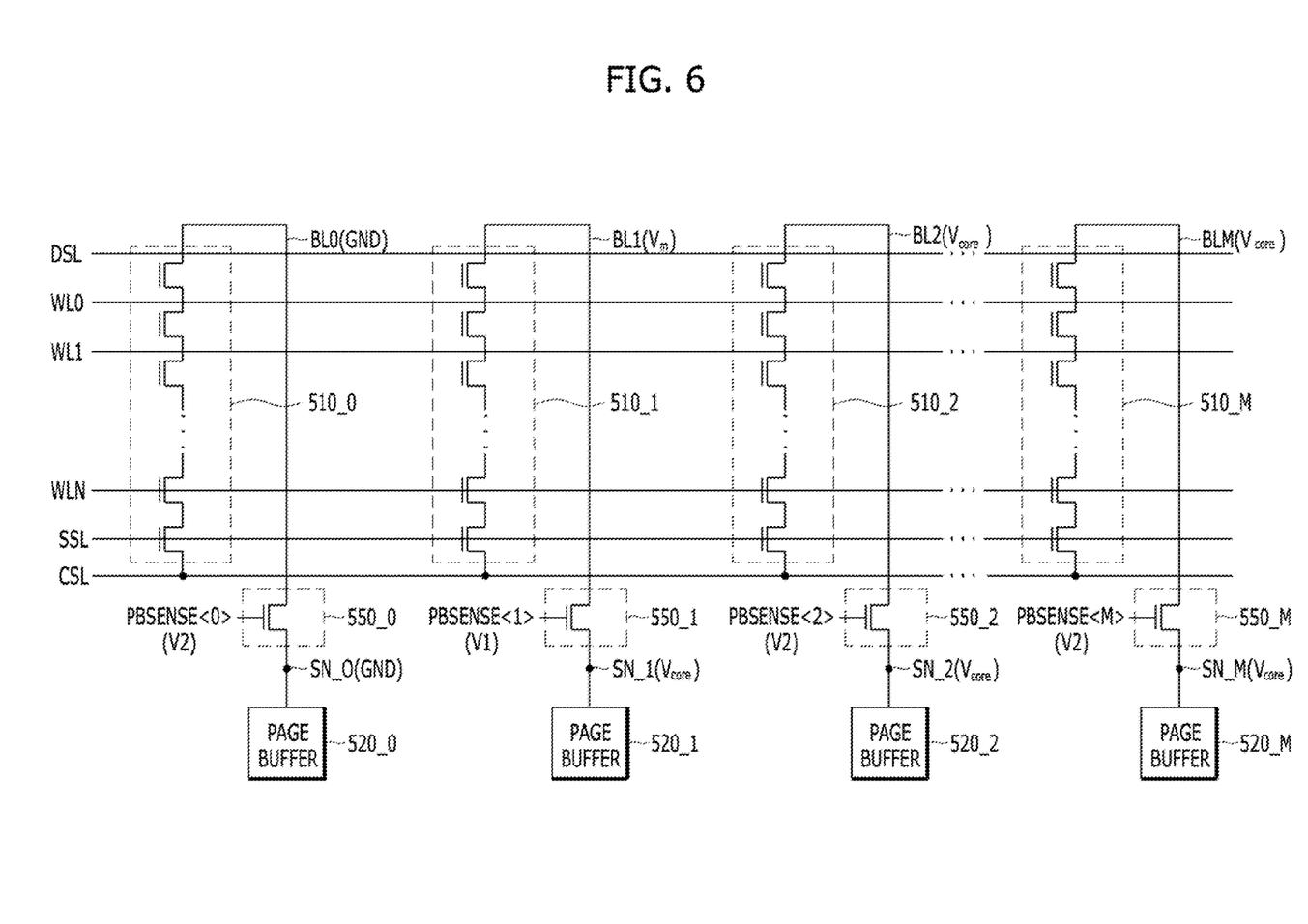
FIG. 6 is a diagram illustrating an operation of the nonvolatile memory device of FIG. 5.

FIG. 6 is a diagram illustrating an operation of the nonvolatile memory device of FIG. 5.

In FIG. 6, it is assumed that a selected memory cell of the cell string 510_0 is a program target cell in the non-program state, a selected memory cell of the cell string 510_1 is a program target cell in the sub-program state, a selected memory cell of the cell string 510_2 is not a program target cell, and a selected memory cell of the cell string 510_M is a program target cell in the program state.

Referring to FIG. 6, the bit line BL0 coupled to the cell string 510_0 may be precharged with the ground voltage GND through the process described with reference to FIG. 4A. The bit line BL1 coupled to the cell string 510_1 may be precharged with the middle voltage $V_m$ through the process described with reference to FIG. 4B. The bit line BL2 coupled to the cell string 510_2 may be precharged with the core voltage $V_{core}$ through the process described with reference to FIG. 4C. The bit line BLM coupled to the cell string 510_M may be precharged with the core voltage $V_{core}$ through the process described with reference to FIG. 4C. The above mentioned precharge operations on the bit lines BL0 to BLM may be performed at the same time.

The nonvolatile memory device of FIG. 5, according to an embodiment of the present invention, may reduce a precharge section because all the bit lines BL0 to BLM are precharged at once regardless of which voltage is used for the pre-charging. Accordingly, the operating speed of the nonvolatile memory device may be enhanced.

The embodiment of present invention may reduce the time needed to precharge the bit lines because the bit lines are precharged with different voltage levels in a single step, at the same time regardless of the state in which the memory cells coupled to the bit lines and regardless of whether the memory cells are program target cells or not. The embodiment of present invention allows precharging of the bit lines in a single step even though it also allows application of different voltages depending upon the state of the memory cells that are coupled to the bit lines and whether the memory cells are target memory cells or not.

Although various embodiments have been described for illustrative purposes, it will be apparent to those skilled in the art that various changes and modifications may be made without departing from the spirit and/or scope of the invention as defined in the following claims.

What is claimed is:

1. A nonvolatile memory device comprising:
a cell string comprising a plurality of memory cells coupled in series;
a bit line coupled to the cell string;
a page buffer suitable for driving a sensing node to a ground voltage, a middle voltage, and a core voltage during a normal program operation, a slow program operation and a program inhibition operation, respectively; and
a connection unit suitable for coupling the bit line to the sensing node in response to a control signal of a first voltage during the slow program operation, and in response to the control signal of a second voltage higher than the first voltage during the normal program operation and the program inhibition operation.

2. The nonvolatile memory device of claim 1, wherein:
the core voltage has a higher voltage level higher than the middle voltage, and
the middle voltage is higher than the ground voltage.

3. The nonvolatile memory device of claim 1, wherein the connection unit comprises a transistor coupled between the bit line and the sensing node, and having a gate receiving the control signal.

4. The nonvolatile memory device of claim 3, wherein:
the first voltage is a sum of the middle voltage and of a threshold voltage of the transistor included in the connection unit, and
the second voltage is a sum of the core voltage and the threshold voltage of the transistor included in the connection unit.

5. The nonvolatile memory device of claim 1, wherein the page buffer stores first data indicative of whether a selected memory cell of the plurality of memory cells is programmed by the slow program operation or not.

6. The nonvolatile memory device of claim 5, further comprising:
a first voltage generation unit suitable for generating the first voltage;
a second voltage generation unit suitable for generating the second voltage;
a first switch suitable for being coupled between the first voltage generation unit and a control terminal of the connection unit and being turned on/off in response to the first data stored in the page buffer; and
a second switch suitable for being coupled between the second voltage generation unit and the control terminal of the connection unit and being turned on/off in response to the first data stored in the page buffer.

7. The nonvolatile memory device of claim 6, wherein:
the first switch is turned on and the second switch is turned off when the first data has a first value, and
the second switch is turned on and the first switch is turned off when the first data has a second value.

8. The nonvolatile memory device of claim 1, wherein:
the bit line is precharged with the ground voltage during the normal program operation,
the bit line is precharged with the middle voltage during the slow program operation, and
the bit line is precharged with the core voltage during the program inhibition operation.

9. A nonvolatile memory device comprising:
a plurality of cell strings comprising a plurality of memory cells coupled in series;
a plurality of bit lines coupled to the plurality of cell strings respectively;
a plurality of page buffers each being suitable for driving a sensing node to a ground voltage, a middle voltage, and a core voltage during a normal program operation, a slow program operation and a program inhibition operation, respectively; and
a plurality of connection units each suitable for coupling the respective bit lines to the sensing node of the respective page buffers in response to a control signal of a first voltage during the slow program operation, and in response to the control signal of a second voltage higher than the first voltage during the normal program operation and the program inhibition operation.

10. The nonvolatile memory device of claim 9, wherein:
the core voltage has a voltage level higher than the middle voltage, and
the middle voltage has a voltage level higher than the ground voltage.

11. The nonvolatile memory device of claim 9, wherein each of the connection unit comprises a transistor coupled between the respective bit lines and the sensing node of the respective page buffers, and having a gate receiving the control signal.

12. The nonvolatile memory device of claim 10, wherein:
the first voltage has a voltage level corresponding to a sum of a voltage level of the middle voltage and a voltage level of a threshold voltage of the transistor included in the connection units, and
the second voltage has a voltage level corresponding to a sum of a voltage level of the core voltage and the voltage level of the threshold voltage of the transistor included in the connection units.

13. The nonvolatile memory device of claim 9, wherein the page buffer stores first data indicative of whether a selected memory cell of each of the cell strings is programmed by the slow program operation or not.

14. The nonvolatile memory device of claim 13, further comprising:
a first voltage generation unit suitable for generating the first voltage;
a second voltage generation unit suitable for generating the second voltage;
a plurality of first switches each suitable for being coupled between the first voltage generation unit and a control terminal of each of the plurality of connection units and being turned on/off in response to the first data stored in each of the plurality of page buffers; and
a plurality of second switches each suitable for being coupled between the second voltage generation unit and the control terminal of each of the plurality of connection units and being turned on/off in response to the first data stored in each of the plurality of page buffers.

15. The nonvolatile memory device of claim 14, wherein:
the first switch is turned on and the second switch is turned off when the first data has a first value, and
the second switch is turned on and the first switch is turned off when the first data has a second value.

16. The nonvolatile memory device of claim 9, wherein:
the bit line is precharged with the ground voltage during the normal program operation,
the bit line is precharged with the middle voltage during the slow program operation, and
the bit line is precharged with the core voltage during the program inhibition operation.

17. The nonvolatile memory device of claim 9, wherein the plurality of bit lines is simultaneously precharged.

* * * * *